United States Patent [19]

Coldren et al.

[11] 3,877,982

[45] Apr. 15, 1975

[54] MONOLITHIC ACOUSTIC SURFACE WAVE AMPLIFIER DEVICE AND METHOD OF MANUFACTURE

[75] Inventors: Larry A. Coldren, Palo Alto; Gordon S. Kino, Stanford, both of Calif.

[73] Assignee: The United States of America as represented by the Secretary of the Army, Washington, D.C.

[22] Filed: Dec. 6, 1973

[21] Appl. No.: 422,494

Related U.S. Application Data

[62] Division of Ser. No. 243,434, April 12, 1972, abandoned.

[52] U.S. Cl. ...................... 427/87; 427/100; 357/26

[51] Int. Cl. ............................................. B44d 1/14

[58] Field of Search ......... 310/8.2; 117/106 A, 201, 117/215, 217

[56] References Cited

UNITED STATES PATENTS

| | | | |
|---|---|---|---|
| 3,469,120 | 9/1969 | Nagao et al. | 117/317 |
| 3,480,484 | 11/1969 | Carroll et al. | 117/215 |
| 3,543,058 | 11/1970 | Klemens | 310/8.2 |
| 3,674,549 | 7/1972 | Ohshita et al. | 117/201 |

*Primary Examiner*—Cameron K. Weiffenbach
*Attorney, Agent, or Firm*—Nathan Edelberg; Robert P. Gibson; Roy E. Gordon

[57] ABSTRACT

A monolithic acoustic surface wave amplifier device is provided by heating a piezoelectric substrate in vacuum and then depositing a thin barrier layer of silicon oxide on the piezoelectric substrate. A thin film of a III–V semiconductor is deposited on the thin barrier layer, the semiconductor film overcoated with a thin film of silicon oxide and the device completed by annealing in argon.

1 Claim, No Drawings

MONOLITHIC ACOUSTIC SURFACE WAVE AMPLIFIER DEVICE AND METHOD OF MANUFACTURE

CROSS REFERENCE TO A RELATED APPLICATION

This is a division of application Ser. No. 243,434 filed Apr. 12, 1972, now abandoned.

BACKGROUND OF THE INVENTION

Heretofore, surface wave amplifiers have been comprised of a thin semiconductor film separated by an extremely small, uniform air gap from a piezoelectric surface. The difficulty with these amplifiers is that they are crucially limited in output power at moderate levels of gain, efficiency and noise figure.

SUMMARY OF THE INVENTION

The general object of this invention is to provide a surface wave amplifier having practical amplifier characteristics. A more specific object of this invention is to provide a surface wave amplifier with improved levels of gain, efficiency, noise, and output power.

The aforementioned objectives have been attained by providing a monolithic device in which the uniform air gap between piezoelectric and semiconductor materials is replaced with a dielectric layer, such as a layer of silicon oxide. The particular semiconductor used is a III–V material such as InSb.

DESCRIPTION OF THE PREFERRED EMBODIMENT

In this embodiment, the monolithic acoustic surface wave amplifier devices includes a $LiNbO_3$ delay line as the piezoelectric substrate and InSb as the III–V semiconductor.

The delay line is first heated in vacuum to about 550° C. and then cooled to about 400° C. A thin barrier layer of about 300 angstroms in thickness of silicon oxide is then deposited on the $LiNbO_3$ delay line. A film of about 500 angstroms in thickness of InSb is then deposited on the barrier layer at about 350° C. The III–V semiconductor film is then overcoated with a thin film of silicon oxide, and the device then annealed in an argon atmosphere at about 450° C. The device has useful gain from VHF to microwave and is capable of yielding > 80dB/cm gain near the frequency of maximum gain at about 1GHz.

The above described monolithic configuration gives more gain, is easier to mass fabricate, and is more reliable than previous separated semiconductor piezoelectric devices.

With the use of high mobility, low effective mass III–V semiconductors, such as InSb, films of about 500 angstroms in thickness provide sufficient mobility for the amplifier's operation. Such thin films give negligible mass loading and, hence, do not alter the dispersionless nature of the Rayleigh surface wave mode. Previous surface wave amplifier devices have never offered both high gain and low dispersion.

In lieu of the $LiNbO_3$ delay line, other piezoelectric substrates may be used such as quartz, $Bi_{12}$ $GeO_{20}$, or lead zinc titanates. Similarly, other III–V semiconductor materials may be used such as InAs or GaAs.

The use of a thin SiO barrier layer between piezoelectric and semiconductor allows for the deposition of very thin layers of high quality semiconductors on an otherwise contaminating substrate. With III–V semiconductors of high mobility and low effective mass, one obtains useful drift mobilities with very thin layers resulting in a dispersionless device.

To obtain useable drive mobilities, it is necessary to anneal in argon at about 450° C. Before annealing, the InSb film is overcoated with a thin film of SiO to prevent antimony sublimation. The annealing promotes further crystallite growth and reduces the density of other defects.

We wish it to be understood that we do not desire to be limited to the exact details of construction shown and described, for obvious modifications will occur to a person skilled in the art.

What is claimed is:

1. Method of making a monolithic acoustic surface wave amplifier device, said method including the steps of A. heating a $LiNbO_3$ delay line piezoelectric substrate in vacuum to a temperature about 550° C. and then cooling to about 400° C.

B. depositing a thin barrier layer of about 300 angstroms in thickness of silicon oxide on the piezoelectric substrate, C. depositing a film of about 500 angstroms in thickness of InSb at about 350° C. on the barrier layer, D. overcoating with a thin film of silicon oxide, and E. annealing in argon at about 450° C.

* * * * *